(12) United States Patent
Reiss et al.

(10) Patent No.: US 8,916,061 B2
(45) Date of Patent: Dec. 23, 2014

(54) CMP COMPOSITIONS SELECTIVE FOR OXIDE AND NITRIDE WITH HIGH REMOVAL RATE AND LOW DEFECTIVITY

(71) Applicant: Cabot Microelectronics Corporation, Aurora, IL (US)

(72) Inventors: Brian Reiss, Woodridge, IL (US); Michael Willhoff, Naperville, IL (US); Daniel Mateja, Oswego, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 13/799,680

(22) Filed: Mar. 13, 2013

(65) Prior Publication Data

US 2013/0244432 A1 Sep. 19, 2013

Related U.S. Application Data

(60) Provisional application No. 61/610,818, filed on Mar. 14, 2012.

(51) Int. Cl.
*H01L 21/3063* (2006.01)
*H01L 21/306* (2006.01)
*C09K 3/14* (2006.01)
*H01L 21/3105* (2006.01)
*C09G 1/02* (2006.01)

(52) U.S. Cl.
CPC ........ *H01L 21/30625* (2013.01); *C09K 3/1463* (2013.01); *H01L 21/31053* (2013.01); *C09G 1/02* (2013.01)
USPC .......................... 252/79.1; 252/79.4; 438/693

(58) Field of Classification Search
None
See application file for complete search history.

(56) References Cited

U.S. PATENT DOCUMENTS

| | | | |
|---|---|---|---|
| 5,114,437 A * | 5/1992 | Takeuchi et al. ................. | 51/293 |
| 5,196,353 A | 3/1993 | Sandhu et al. | |
| 5,433,651 A | 7/1995 | Lustig et al. | |
| 5,489,233 A | 2/1996 | Cook et al. | |
| 5,527,423 A | 6/1996 | Neville et al. | |
| 5,609,511 A | 3/1997 | Moriyama et al. | |
| 5,643,046 A | 7/1997 | Katakabe et al. | |
| 5,658,183 A | 8/1997 | Sandhu et al. | |
| 5,730,642 A | 3/1998 | Sandhu et al. | |
| 5,838,447 A | 11/1998 | Hiyama et al. | |
| 5,872,633 A | 2/1999 | Holzapfel et al. | |
| 5,893,796 A | 4/1999 | Birang et al. | |
| 5,949,927 A | 9/1999 | Tang | |
| 5,958,794 A | 9/1999 | Bruxvoort et al. | |
| 5,964,643 A | 10/1999 | Birang et al. | |
| 6,062,968 A | 5/2000 | Sevilla et al. | |
| 6,117,000 A | 9/2000 | Anjur et al. | |
| 6,126,532 A | 10/2000 | Sevilla et al. | |
| 6,376,381 B1 | 4/2002 | Sabde | |
| 6,443,811 B1 * | 9/2002 | Nojo et al. ....................... | 451/41 |
| 6,544,892 B2 | 4/2003 | Her et al. | |
| 6,626,968 B2 | 9/2003 | Park et al. | |
| 6,844,026 B2 * | 1/2005 | Anthony et al. ............... | 427/212 |
| 7,122,581 B1 * | 10/2006 | Braconnier ...................... | 516/89 |
| 8,173,039 B2 * | 5/2012 | Nho et al. ..................... | 252/79.1 |
| 8,637,153 B2 * | 1/2014 | Cho et al. ....................... | 428/402 |
| 8,647,445 B1 * | 2/2014 | Chhabra et al. .................. | 134/29 |
| 2002/0086618 A1 * | 7/2002 | Ota et al. ......................... | 451/41 |
| 2003/0060135 A1 * | 3/2003 | Moeggenborg et al. ......... | 451/41 |
| 2003/0064596 A1 * | 4/2003 | Lee et al. ....................... | 438/692 |
| 2003/0148614 A1 * | 8/2003 | Simpson et al. ............... | 438/692 |
| 2004/0223898 A1 * | 11/2004 | Ota et al. ....................... | 423/263 |
| 2005/0003744 A1 | 1/2005 | Feng et al. | |
| 2005/0153643 A1 * | 7/2005 | Simpson et al. ............... | 451/526 |
| 2005/0153858 A1 * | 7/2005 | Anthony et al. ............... | 510/301 |
| 2005/0159085 A1 * | 7/2005 | Scott ................................ | 451/41 |
| 2006/0032836 A1 * | 2/2006 | Feng et al. ........................ | 216/88 |
| 2006/0148667 A1 * | 7/2006 | Fukasawa et al. ............. | 510/178 |
| 2006/0234509 A1 * | 10/2006 | Small et al. .................... | 438/692 |
| 2007/0134410 A1 * | 6/2007 | Anthony et al. ............... | 427/212 |
| 2007/0175104 A1 * | 8/2007 | Nishiyama et al. ............. | 51/307 |
| 2007/0200089 A1 | 8/2007 | Inaba et al. | |
| 2007/0218811 A1 * | 9/2007 | Kurata et al. .................... | 451/28 |
| 2008/0242091 A1 | 10/2008 | Kato et al. | |
| 2009/0004863 A1 * | 1/2009 | Kamimura ..................... | 438/692 |
| 2009/0215271 A1 * | 8/2009 | Dysard et al. ................. | 438/693 |
| 2009/0221145 A1 * | 9/2009 | Inada et al. .................... | 438/693 |
| 2009/0246956 A1 * | 10/2009 | Takamiya et al. ............. | 438/693 |
| 2010/0003897 A1 * | 1/2010 | Kim et al. ......................... | 451/41 |
| 2010/0087065 A1 * | 4/2010 | Boggs et al. ................... | 438/692 |
| 2010/0178767 A1 * | 7/2010 | Schubert et al. ............... | 438/692 |
| 2011/0028073 A1 * | 2/2011 | Fukasawa et al. ............... | 451/41 |
| 2011/0045671 A1 * | 2/2011 | Behrens et al. ................ | 438/693 |
| 2012/0129346 A1 * | 5/2012 | Ryuzaki et al. ................ | 438/693 |
| 2012/0270400 A1 * | 10/2012 | Takegoshi et al. ............. | 438/692 |
| 2012/0299158 A1 * | 11/2012 | Shinoda et al. ................ | 257/618 |
| 2013/0059439 A1 * | 3/2013 | Shinoda et al. ................ | 438/693 |
| 2013/0200039 A1 * | 8/2013 | Noller et al. .................... | 216/13 |
| 2013/0244432 A1 * | 9/2013 | Reiss et al. .................... | 438/693 |

* cited by examiner

FOREIGN PATENT DOCUMENTS

WO    WO 2011058952 A1 *  5/2011

OTHER PUBLICATIONS

Lee et al., "Effects of Nonionic Surfactants on Oxide-to-Polysilicon Selectivity during Chemical Mechanical Polishing," *Journal of the Electrochemical Society*, 149(8): G477-G481 (Jun. 2002).

*Primary Examiner* — Allan Olsen
(74) *Attorney, Agent, or Firm* — Thomas E Omholt; Derek W Barnett; Arlene Hornilla

(57) ABSTRACT

The invention relates to a chemical-mechanical polishing composition comprising a ceria abrasive, cations of one or more lanthanide metals, one or more nonionic polymers, water, and optionally one or more additives. The invention further relates to a method of chemically-mechanically polishing a substrate with the inventive chemical-mechanical polishing composition. Typically, the substrate comprises one or more of silicon oxide, silicon nitride, and polysilicon.

16 Claims, No Drawings

CMP COMPOSITIONS SELECTIVE FOR OXIDE AND NITRIDE WITH HIGH REMOVAL RATE AND LOW DEFECTIVITY

BACKGROUND OF THE INVENTION

Compositions and methods for planarizing or polishing the surface of a substrate are well known in the art. Polishing compositions (also known as polishing slurries) typically contain an abrasive material in a liquid carrier and are applied to a surface by contacting the surface with a polishing pad saturated with the polishing composition. Typical abrasive materials include silicon dioxide, cerium oxide, aluminum oxide, zirconium oxide, and tin oxide. U.S. Pat. No. 5,527,423, for example, describes a method for chemically-mechanically polishing a metal layer by contacting the surface with a polishing slurry comprising high purity fine metal oxide particles in an aqueous medium. Polishing compositions are typically used in conjunction with polishing pads (e.g., a polishing cloth or disk). Suitable polishing pads are described in U.S. Pat. Nos. 6,062,968, 6,117,000, and 6,126,532, which disclose the use of sintered polyurethane polishing pads having an open-celled porous network, and U.S. Pat. No. 5,489,233, which discloses the use of solid polishing pads having a surface texture or pattern. Instead of, or in addition to, being suspended in the polishing composition, the abrasive material may be incorporated into the polishing pad. U.S. Pat. No. 5,958,794 discloses a fixed abrasive polishing pad.

As a method for isolating elements of a semiconductor device, a great deal of attention is being directed towards a shallow trench isolation (STI) process where a silicon nitride layer is formed on a silicon substrate, shallow trenches are formed via etching or photolithography, and a dielectric layer (e.g., an oxide) is deposited to fill the trenches. Due to variation in the depth of trenches, or lines, formed in this manner, it is typically necessary to deposit an excess of dielectric material on top of the substrate to ensure complete filling of all trenches. The excess dielectric material is then typically removed by a chemical-mechanical planarization process to expose the silicon nitride layer. When the silicon nitride layer is exposed, the largest area of the substrate exposed to the chemical-mechanical polishing composition comprises silicon nitride, which must then be polished to achieve a highly planar and uniform surface.

Generally, past practice has been to emphasize selectivity for oxide polishing in preference to silicon nitride polishing. Thus, the silicon nitride layer has served as a stopping layer during the chemical-mechanical planarization process, as the overall polishing rate decreased upon exposure of the silicon nitride layer. For example, U.S. Pat. No. 6,544,892 and references cited therein describe polishing compositions which provide selectivity of silicon dioxide to silicon nitride. Also, U.S. Pat. No. 6,376,381 describes the use of certain nonionic surfactants to increase the polishing selectivity between silicon oxide and silicon nitride layers.

Recently, selectivity for oxide polishing in preference to polysilicon polishing has also been emphasized. For example, the addition of a series of BRIJ™ and polyethylene oxide surfactants, as well as PLURONIC™ L-64, an ethylene oxide-propylene oxide-ethylene oxide triblock copolymer with an HLB of 15, is purported to increase the polishing selectivity of oxide to polysilicon (see Lee et al., "Effects of Nonionic Surfactants on Oxide-to-Polysilicon Selectivity during Chemical Mechanical Polishing,". *J. Electrochem. Soc.*, 149(8): G477-G481 (2002)). Also, U.S. Pat. No. 6,626,968 purports to obtain polishing selectivity of silicon oxide to polysilicon through the use of a polymer additive having hydrophilic and hydrophobic functional groups selected from polyvinylmethylether, polyethylene glycol, polyoxyethylene 23 lauryl ether, polypropanoic acid, polyacrylic acid, and polyether glycol bis(ether).

The STI substrate is typically polished using a conventional polishing medium and an abrasive-containing polishing slurry. However, polishing STI substrates with conventional polishing media and abrasive-containing polishing slurries has been observed to result in overpolishing of the substrate surface or the formation of recesses in the STI features and other topographical defects such as microscratches on the substrate surface. This phenomenon of overpolishing and forming recesses in the STI features is referred to as dishing. Dishing is also used to refer to overpolishing and forming recesses in other types of features. Dishing is undesirable because dishing of substrate features may detrimentally affect device fabrication by causing failure of isolation of transistors and transistor components from one another, resulting in short-circuits. Additionally, overpolishing of the substrate may also result in oxide loss and exposure of the underlying oxide to damage from polishing or chemical activity, which detrimentally affects device quality and performance.

Despite these polishing compositions and methods, there remains a need in the art for polishing compositions and methods that can provide desirable selectivity of silicon oxide, silicon nitride, and polysilicon and that have suitable removal rates, low defectivity, and suitable dishing performance. The invention provides such a composition and method. These and other advantages of the invention, as well as additional inventive features, will be apparent from the description of the invention provided herein.

BRIEF SUMMARY OF THE INVENTION

The invention provides a chemical-mechanical polishing composition comprising a ceria abrasive, cations of one or more lanthanide metals, one or more nonionic polymers, and water. The invention further provides a method of chemically-mechanically polishing a substrate with the inventive chemical-mechanical polishing composition. Typically, the substrate comprises silicon oxide, silicon nitride, and/or polysilicon.

The chemical-mechanical polishing composition in accordance with the invention exhibits a desirable selectivity of silicon oxide, silicon nitride, and/or polysilicon (e.g., exhibits a high removal rate on silicon oxide and silicon nitride and a low removal rate on polysilicon). In addition, the chemical-mechanical polishing composition of the invention desirably exhibits a low particle defectivity when polishing a substrate in accordance with a method of the invention. Moreover, at least some embodiments of the polishing composition in accordance with the invention have a low solids content, thereby being of relatively low cost.

In various embodiments of the invention, the chemical-mechanical polishing composition can further comprise one or more additives so as to achieve the desired result.

DETAILED DESCRIPTION OF THE INVENTION

The invention provides a chemical-mechanical polishing (CMP) composition and a method of chemically-mechanically polishing a substrate, wherein the polishing composition comprises, consists essentially of, or consists of a ceria abrasive, cations of one or more lanthanide metals, one or more nonionic polymer(s), and water.

The chemical-mechanical polishing composition of the invention comprises a ceria abrasive. As known to one of ordinary skill in the art, ceria is an oxide of the rare earth metal cerium, and is also known as ceric oxide, cerium oxide (e.g., cerium(IV) oxide), or cerium dioxide. Cerium(IV) oxide can be formed by calcining cerium oxalate or cerium hydroxide. Cerium also forms cerium(III) oxides such as, for example, $Ce_2O_3$ and $CeO_2$, wherein $CeO_2$ is typically the most stable phase at room temperature and under atmospheric conditions. The ceria abrasive can be any one or more of these or other oxides of ceria.

The ceria abrasive can be of any suitable form. As used herein, "wet-process" ceria refers to a ceria prepared by a precipitation, condensation-polymerization, or similar process. A polishing composition of the invention comprising a wet-process ceria abrasive has been typically found to exhibit lower defects when polishing substrates according to a method of the invention. Without wishing to be bound to a particular theory, it is believed that wet-process ceria forms spherical ceria particles and/or smaller aggregate ceria particles, thereby resulting in lower substrate defectivity when used in the inventive method. An illustrative wet-process ceria is HC-60™ commercially available from Rhodia.

The ceria particles can have any suitable average size (i.e., average particle diameter). If the average ceria particle size is too small, the polishing composition may not exhibit sufficient removal rate. In contrast, if the average ceria particle size is too large, the polishing composition may exhibit undesirable polishing performance such as, for example, poor substrate defectivity. Accordingly, the ceria particles can have an average particle size of about 10 nm or more, for example, about 15 nm or more, about 20 nm or more, about 25 nm or more, or about 50 nm or more. Alternatively, or in addition, the ceria can have an average particle size of about 10,000 nm or less, for example, about 7,500 nm or less, about 5,000 nm or less, about 1,000 nm or less, about 750 nm or less, about 500 nm or less, about 250 nm or less, about 150 nm or less, about 100 nm or less, about 75 nm or less, or about 50 nm or less. Thus, the ceria can have an average particle size bounded by any two of the aforementioned endpoints. For example, the ceria can have an average particle size of about 10 nm to about 10,000 nm, about 10 nm to about 7,500 nm, about 15 nm to about 5,000 nm, about 20 nm to about 1,000 nm, about 50 nm to about 250 nm, or about 50 nm to about 150 nm. For non-spherical ceria particles, the size of the particle is the diameter of the smallest sphere that encompasses the particle. The particle size of the ceria can be measured using any suitable technique, for example, using laser diffraction techniques. Suitable particle size measurement instruments are available from e.g., Malvern Instruments (Malvern, UK).

The ceria particles preferably are colloidally stable in the inventive polishing composition. The term colloid refers to the suspension of ceria particles in the liquid carrier (e.g., water). Colloidal stability refers to the maintenance of that suspension through time. In the context of this invention, an abrasive is considered colloidally stable if, when the abrasive is placed into a 100 mL graduated cylinder and allowed to stand unagitated for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of particles in the abrasive composition ([C] in terms of g/mL) is less than or equal to 0.5 (i.e., $\{[B]-[T]\}/[C] \leq 0.5$). More preferably, the value of $[B]-[T]/[C]$ is less than or equal to 0.3, and most preferably is less than or equal to 0.1.

The polishing composition can comprise any suitable amount of ceria abrasive. If the polishing composition of the invention comprises too little ceria abrasive, the composition may not exhibit sufficient removal rate. In contrast, if the polishing composition comprises too much ceria abrasive, then the polishing composition may exhibit undesirable polishing performance and/or may not be cost effective and/or may lack stability. The polishing composition can comprise about 10 wt. % or less of ceria, for example, about 9 wt. % or less, about 8 wt. % or less, about 7 wt. % or less, about 6 wt. % or less, about 5 wt. % or less, about 4 wt. % or less, about 3 wt. % or less, about 2 wt. % or less, about 1 wt. % or less, or about 0.6 wt. % or less of ceria. Alternatively, or in addition, the polishing composition can comprise about 0.001 wt. % or more of ceria, for example, about 0.005 wt. % or more, about 0.01 wt. % or more, about 0.1 wt. % or more, about 0.2 wt. % or more, about 0.3 wt. % or more, about 0.4 wt. % or more, about 0.5 wt. % or more, or about 1 wt. % or more of ceria. Thus, the polishing composition can comprise ceria in an amount bounded by any two of the aforementioned endpoints. For example, the polishing composition can comprise about 0.001 wt. % to about 10 wt. % of ceria, about 0.005 wt. % to about 9 wt. %, about 0.01 wt. % to about 8 wt. %, about 0.1 wt. % to about 7 wt. %, about 0.2 wt. % to about 6 wt. %, about 0.3 wt. % to about 5 wt. % of ceria, about 0.4 wt. % to about 4 wt. %, or about 0.5 wt. % to about 2 wt. % of ceria. In a preferred embodiment, the polishing composition comprises, at point-of-use, about 0.2 wt. % to about 0.6 wt. % of ceria.

The chemical-mechanical polishing composition of the invention comprises cations of one or more lanthanide metals. Polishing compositions that do not contain lanthanide metal cations have been found to exhibit undesirable polishing properties (e.g., inadequate removal rate, poor selectivity, and/or poor substrate defectivity performance). As known to one of ordinary skill in the art, lanthanide metals or "lanthanoids" (herein "Ln") are the atomic elements with atomic numbers 57 through 71, from lanthanum (La) to lutetium (Lu). The lanthanide metals typically form trivalent cations (e.g., $Ln^{3+}$) whose chemistry is, in part, determined by the ionic radius, which decreases from lanthanum to lutetium, that is, with increasing atomic number. Not wishing to be bound to a particular theory, it is believed that the lanthanide cations act as a rate enhancer in the inventive polishing composition by modifying the surface of the ceria particles by increasing the number of Lewis acid sites.

The polishing composition of the invention can comprise one or more of any suitable lanthanide cations. Illustrative lanthanide cations include trivalent cations of lanthanum (La), neodymium (Nd), gadolinium (Gd), holmium (Ho), ytterbium (Yb), and mixtures thereof. The polishing composition of the invention typically is prepared with one or more lanthanide salts as a source of lanthanide cations. The lanthanide salts are preferably water-soluble and include organic salts and/or inorganic salts such as nitrate, phosphate, and sulfate salts of lanthanide metals. In a preferred embodiment, the lanthanide salt is a lanthanide nitrate, for example, $La(NO_3)_3$, $Nd(NO_3)_3$, $Gd(NO_3)_3$, $Ho(NO_3)_3$, and/or $Yb(NO_3)_3$.

The polishing composition can comprise any suitable concentration of lanthanide cations. If the concentration of lanthanide cations is too low, a beneficial rate enhancement effect may not be observed. Alternatively, if the concentration of lanthanide cations is too high, the polishing composition may not exhibit desirable polishing properties and/or may not be cost effective. Accordingly, the polishing composition can have a lanthanide cation concentration of about 10 ppm or more, for example, about 20 ppm or more, about 30 ppm or more, about 40 ppm or more, about 50 ppm or more, about 100 ppm or more, or about 150 ppm or more. Alternatively, or in addition, the polishing composition can have a lanthanide cation concentration of about 5,000 ppm or less, e.g., about 4,500 ppm or less, about 4,000 ppm or less, about 3,500 ppm or less, about 3,000 ppm or less, about 2,500 ppm or less, about 2,000 ppm or less, or about 1,500 ppm or less. Thus, the polishing composition can have a lanthanide cation concentration bounded by any two of the aforementioned endpoints. For example, the polishing composition can have a lanthanide concentration of about 10 ppm to about 5,000 ppm, about 20 ppm to about 4,500 ppm, about 30 ppm to about 4,000 ppm, or about 40 ppm to about 4,000 ppm.

The chemical-mechanical polishing composition of the invention comprises one or more nonionic polymers. In accordance with an embodiment of the invention, the polishing composition comprises one or more nonionic polymers selected from the group consisting of alkylene oxide containing polymers, acrylamide polymers, and mixtures thereof. The nonionic polymers are preferable water-soluble and compatible with other components of the polishing composition. The nonionic polymer has been found to assist in reducing the removal rate of polysilicon. The polysilicon portion of the substrate typically is mechanically softer than silicon oxide and silicon nitride and thus experiences excessive mechanical abrasion when polished using a polishing composition suitable for substrates comprising silicon oxide and/or silicon nitride. Not wishing to be bound by any particular theory, it is believed that the nonionic polymer is adsorbed onto the polysilicon portion of the substrate, thereby forming a lubricating film that reduces the contact of the abrasive particles and other components of the polishing composition with the polysilicon surface. The presence of a nonionic polymer in the inventive polishing composition advantageously allows for useful removal rates for silicon oxide and/or silicon nitride while reducing removal rates for polysilicon.

The polishing composition of the invention can comprise more than one nonionic polymer. For example, in some embodiments, the polishing composition comprises more than one type of alkylene oxide containing polymer. Moreover, the polishing composition can comprise one or more alkylene oxide containing polymers in combination with one or more acrylamide polymers. In some embodiments, the polishing composition comprises a copolymer of different alkylene oxide containing polymers.

In an embodiment, the nonionic polymer comprises or is an alkylene oxide containing polymer. The alkylene oxide containing polymer desirably is compatible with the other components (e.g., ceria abrasive, lanthanide cations, any optional additives, and the like) of the polishing composition and exhibits desirable polishing performance. Suitable alkylene oxide containing polymers include, for example, polyethylene glycol(s), polypropylene glycol(s), polyetheramines, ethoxylated acetylenic diols, and mixtures thereof. In an embodiment, the alkylene oxide containing polymer comprises or is polyethylene glycol. In another embodiment, the alkylene oxide containing polymer comprises or is polypropylene glycol. In yet another embodiment, the alkylene oxide containing polymer comprises or is a copolymer of different polyalkylene oxide polymers (e.g., a block copolymer of polyethylene oxide and polypropylene oxide).

The polishing composition can comprise any suitable amount of the one or more alkylene oxide containing polymers. If the amount of alkylene oxide containing polymers is too low, then the polysilicon removal rate may be too high. In contrast, if the amount of alkylene oxide containing polymers is too high, the polishing composition may exhibit undesirable polishing properties and/or may not be cost effective. Accordingly, the polishing composition can comprise about 5 wt. % or less of alkylene oxide containing polymers, for example, about 4.5 wt. % or less, about 4 wt. % or less, about 3.5 wt. % or less, about 3 wt. % or less, about 2.5 wt. % or less, or about 2 wt. % or less of alkylene oxide containing polymers. Alternatively, or in addition, the polishing composition can comprise about 0.01 wt. % or more of alkylene oxide containing polymers, for example, about 0.05 wt. % or more, about 0.1 wt. % or more, about 0.15 wt. % or more, about 0.2 wt. % or more, about 0.25 wt. % or more, about 0.3 wt. % or more, about 0.35 wt. % or more, about 0.4 wt. % or more, about 0.45 wt. % or more, or about 0.5 wt. % of alkylene oxide containing polymers. Thus, the polishing composition can comprise one or more alkylene oxide containing polymers in an amount bounded by any two of the aforementioned endpoints. For example, the polishing composition can comprise about 0.01 wt. % to about 5 wt. %, about 0.05 wt. % to about 4.5 wt. %, or about 0.1 wt. % to about 4 wt. % of one or more alkylene oxide containing polymers.

The alkylene oxide containing polymer can have any suitable molecular weight. If the molecular weight of the alkylene oxide containing polymer is too low, then no advantage is obtained with the use of the alkylene oxide containing polymer. Alternatively, if the molecular weight of the alkylene oxide containing polymer is too large, the removal rate of the silicon oxide and/or silicon nitride can be reduced to impractically low levels. In an embodiment, the alkylene oxide containing polymer has an average molecular weight of about 100,000 g/mol or less, for example, about 75,000 g/mol, about 50,000 g/mol, or about 25,000 g/mol or less. In another embodiment, the alkylene oxide containing polymer has a molecular weight of about 10,000 g/mol or less (e.g., about 7,500 g/mol, or about 5,000 g/mol or less).

The alkylene oxide containing polymer can comprise or is any suitable block copolymer comprising polyethylene oxide blocks, for example, a polyethylene oxide/polypropylene oxide block copolymer ("PEO/PPO copolymer"). The PEO/PPO copolymer can be any suitable PEO/PPO copolymer and preferably is end-functionalized with a primary hydroxyl group or a secondary hydroxyl group. The PEO/PPO copolymer desirably has a hydrophilic-lipophilic balance (HLB) value of about 25 or less. Accordingly, the number of ethylene oxide repeating units in the PEO/PPO copolymer typically will be less than the number of propylene oxide repeating units. Preferably, the number of ethylene oxide units is less than 40 wt. %, less than 30 wt. %, less than 25 wt. %, or even less than 20 wt. % of the PEO/PPO copolymer. The PEO/PPO copolymer preferably has an HLB of about 23 or less, about 18 or less, about 12 or less, about 10 or less, about 9 or less, about 8 or less, about 7 or less, about 6 or less, or about 5 or less. Preferably, the PEO/PPO copolymer has an HLB of about 1 or more (e.g., about 1 to about 23, about 1 to about 18, about 1 to about 12, about 1 to about 10, about 1 to about 9, about 1 to about 8, about 1 to about 7, about 1 to about 6, or about 1 to about 5), or about 2 or more (e.g., about 2 to about 23, about 2 to about 18, about 2 to about 12, about 2 to about 10, about 2 to about 8, about 2 to about 6, or about 2 to about 5), or about 3 or more (e.g., about 3 to about 23, about 3 to about 18, about 3 to about 12, about 3 to about 9, about 3 to about 7, about 3 to about 6, or about 3 to about 5). The PEO/PPO copolymer can have any suitable molecular weight. Desirably the PEO/PPO copolymer has a molecular weight of about 4,000 g/mol or less (e.g., about 3,500 g/mol or less, about 3,000(g/mol or less, about 2,500 g/mol or less, about 2,250 g/mol or less, about 2,000 g/mol or less, about 1,750 g/mol or less, about 1.500 g/mol or less, or even about 1,250 g/μmol or less). Alternatively, or in addition, the PEO/PPO copolymer has a molecular weight of about 200 g/mol or more (e.g., about 300 g/mol or more, about 400 g/mol or more, or about 500 g/mol or more. Thus, the PEO/PPO copolymer can have a molecular weight of about 200 g/mol to about 4,000 g/mol, about 300 g/mol to about 3,000 g/mol, or about 500 g/mol to about 2,500 g/mol). In different preferred embodiments, the molecular weight of the PEO/PPO copolymer is 2,500 g/mol, 1,950 g/mol, 1,900 g/mol, 1850 g/mol, and 1,100 g/mol.

The polishing composition comprises a suitable amount of the PEO/PPO copolymer at the point-of-use although using a relatively large amount of the PEO/PPO copolymer can lead to unwanted inhibition of the polishing rate of substrate layers other than the polysilicon layer. Accordingly, the polishing composition comprises about 1 ppm to about 3,000 ppm of the PEO/PPO copolymer at the point-of-use based on the total weight of the liquid carrier and any components dissolved or suspended therein. The polishing composition can comprise about 5 ppm or more, about 50 ppm or more, about 100 ppm or more, about 250 ppm or more, about 500 ppm or more, or about 1,000 ppm or more of a PEO/PPO copolymer. Alternatively, or in addition to, the polishing composition can comprise about 3,000 ppm or less, about 2,500 ppm or less, about 2,000 ppm or less, or about 1,500 pp or less of a PEO/PPO copolymer. Thus, the polishing composition can comprise a PEO/PPO copolymer in an amount bounded by any two of the aforementioned endpoints. For example, the polishing composition can comprise about 1 ppm to about 3,000 ppm, about 5 ppm to about 2,500 ppm, about 50 ppm to 3,000 ppm of a PEO/PPO copolymer, and the like. In a preferred embodiment, the polishing composition comprises about 500 ppm of the PEO/PPO copolymer at point-of-use.

The PEO/PPO copolymer can comprise or be a PLURONIC™ copolymer commercially available from BASF. The PLURONIC™ products are block copolymers based on ethylene oxide and propylene oxide. Illustrative PLURONIC™ copolymers include PLURONIC™ 10RS, PLURONIC™ L31, PLURONIC™ L35. PLURONIC™ L43, and PLURONIC™ L62. In a preferred embodiment, the PEO/PPO copolymer is PLURONIC™ L31 copolymer.

The alkylene oxide containing polymer can comprise or be a polyetheramine compound. Suitable polyetheramine compounds include those which are compatible with the other components of the polishing composition and which exhibit desirable polishing characteristics. Illustrative polyetheramine compounds include the JEFFAMINE™ family of amines commercially available from Huntsman. The JEFFAMINE™ polyetheramines consist of monoamines, diamines, and triamines, which are available in a variety of molecular weights, ranging up to 5,000 g/mol. The JEFFAMINE™ polyetheramines are polyoxyalkyleneamines containing primary amino groups attached to the terminus of a polyether backbone. The polyether backbone is based either on propylene oxide (PO), ethylene oxide (EO), or mixed EO/PO (e.g., O,O'-bis(2-aminopropyl) polypropylene glycol-block-polyethylene glycol-block-polypropylene glycol). The reactivity of the polyetheramine can be modified by hindering the primary amine or through secondary amine functionality.

In a preferred embodiment, the polyetheramine comprises or is a polyether diamine. Exemplary polyether diamine compounds include the JEFFAMINE™ ED diamines, which are based on a predominantly PEG backbone and have an approximate molecular weight of about 200 to about 2,000 g/mol. The JEFFAMINE™ ED diamines are water-soluble polyether diamine compounds of formula (I):

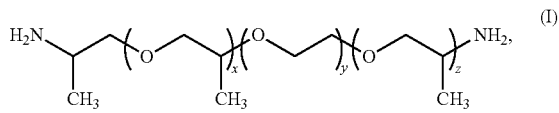

wherein y is a rational number from 2 to about 40, and wherein x and z are rational numbers such that x+z has a value of about 1 to about 6. The JEFFAMINE™ ED polyether diamines include JEFFAMINE™ HK-511 having an approximate molecular weight of 220 and wherein y is 2.0 and the value of x+z is about 1.2; JEFFAMINE™ ED-600 (XTJ-500) having an approximate molecular weight of 600 and wherein y is about 9.0 and the value of x+z is about 3.6; JEFFAMINE™ ED-900 (XTJ-501) having an approximate molecular weight of 900 and wherein y is about 12.5 and the value of x+z is about 6.0; and JEFFAMINE™ ED-2003 (XTJ-502) having an approximate molecular weight of 2,000 and wherein y is about 39 and the value of x+z is about 6.0.

The alkylene oxide containing polymer can comprise or be an ethoxylated acetylenic diol compound. The ethoxylated acetylenic diol can be any suitable diol which is compatible with the other components (e.g., ceria abrasive, lanthanide cations, any optional additive, and the like) of the polishing composition and exhibits desirable polishing performance. Illustrative ethoxylated acetylenic diol compounds include compounds such as the SURFYNOL™ 400 series nonionic surfactants commercially available from Air Products. The SURFYNOL™ 400 series of surfactants is based on ethoxylated 2,4,7,9-tetramethyl-5-decyn-4,7-diol of the formula:

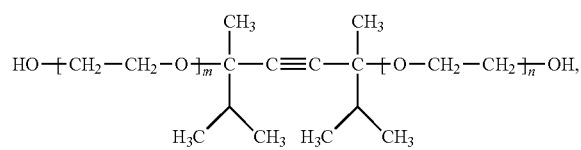

wherein the value of m+n is the equal to the number of moles of ethylene oxide. Depending on the extent of ethoxylation, SURFYNOL™ 400 series surfactants function as low-foaming, nonfoaming, or defoaming wetting agents and include SURFYNOL™ 420, SURFYNOL™ 440, SURFYNOL™ 465, and SURFYNOL™485, each of which vary in the amount of ethylene oxide content. As the amount of ethyoxylation is increased, static surface tension at a specific concentration increases, and the surfactant becomes more hydrophilic. This increased water solubility permits higher use levels of surfactant to desirably produce low static surface tensions. A particularly preferred ethoxylated acetylenic diol is SURFYNOL™ 485.

In an embodiment, the nonionic polymer comprises or is an acrylamide polymer compound. The acrylamide polymer can be any suitable acrylamide polymer which is compatible with the other components (e.g., ceria abrasive, lanthanide cations, any optional additives, and the like) of the polishing composition and exhibits desirable polishing performance. Not wishing to be bound to any particular theory, it is believed that the acrylamide polymer acts to stabilize the ceria abrasive particle. An illustrative acrylamide polymer is, for example, polyacrylamide.

The acrylamide polymer can have any suitable molecular weight. Desirably, the acrylamide polymer has a molecular weight such that it exhibits a beneficial effect on the stability of the ceria particles. In an embodiment, the acrylamide polymer has a molecular weight of about 8,000 g/mol or higher, such as about 10,000 g/mol.

The polishing composition can comprise any suitable amount of one or more acrylamide polymers. If the amount of acrylamide polymers in the polishing composition is too low, then no beneficial effect on ceria abrasive stability is obtained. In contrast, if the amount of acrylamide polymers in the polishing composition is too high, the polishing composition may exhibit undesirable polishing properties and/or may not be cost effective. Accordingly, the polishing composition of the invention can comprise about 0.5 wt. % or less of acrylamide polymers, for example, about 0.4 wt. % or less, about 0.3 wt or less, about 0.2 wt. % or less, about 0.1 wt. % or less, or about 0.05 wt. % or less of acrylamide polymers. Alternatively, or in addition, the polishing composition can comprise about 0.001 wt. % or more of acrylamide polymers, for example, about 0.002 wt. % or more, about 0.01 wt. % or more, about 0.02 wt % or more, about 0.0375 wt. % or more, about 0.05 wt. % or more, about 0.075 wt. % or more, or about 0.1 wt. % or more of acrylamide polymers. Thus, the polishing composition can comprise one or more acrylamide polymers in an amount bounded by any two of the aforementioned endpoints. For example, the polishing composition can comprise about 0.01 wt. % to about 0.5 wt. %, about 0.02 wt. % to about 0.4 wt. %, or about 0.0375 wt. % to about 0.3 wt. % of one or more acrylamide polymers.

The chemical-mechanical polishing composition of the invention optionally further comprises one or more additives. Illustrative additives include conditioners, acids (e.g., phosphonic acids and/or sulfonic acids), complexing agents (e.g., anionic polymeric complexing agents), chelating agents, biocides, scale inhibitors, dispersants, etc. It will be understood that any of the components of the polishing composition that are acids, bases, or salts (e.g., organic carboxylic acid, base, and/or alkali metal carbonate, etc.), when dissolved in the water of the polishing composition, can exist in dissociated form as cations and anions. The amounts of such compounds present in the polishing composition as recited herein will be understood to refer to the weight of the undissociated compound used in the preparation of the polishing composition.

In an embodiment, the chemical-mechanical polishing composition of the invention further comprises one or more anionic polymeric complexing agents. Not wishing to be bound to any particular theory, it is believed that an anionic polymeric complexing agent, when present, helps to reduce the removal rate of polysilicon during polishing. The anionic polymeric complexing agent desirably is compatible with the other components (e.g., ceria abrasive, lanthanide cations, nonionic polymers, any optional additives, and the like) of the polishing composition and exhibits desirable polishing performance. Illustrative anionic polymeric complexing agents include, for example, polycarboxylic acids and polysulfonic acids. In a preferred embodiment, the anionic polymeric complexing agent is a polycarboxylic acid selected from the group consisting of polyacrylic acids, poly(methacrylic) acid, and mixtures thereof.

Accordingly, the polishing composition can comprise any suitable amount of anionic polymeric complexing agents. If the amount of anionic polymeric complexing agents is too low, a beneficial effect on polysilicon removal rate is not observed. Alternatively, if the amount of anionic polymeric complexing agents is too high, the ceria abrasive particles, in the presence of the lanthanide cations, tend to agglomerate with the negatively charged polymer, thereby having a detrimental effect on colloidal stability of the ceria abrasive particles and the polishing composition. In an embodiment, the polishing composition comprises about 1,500 ppm or less of anionic polymeric complexing agents, for example, about 1,000 ppm or less, about 750 ppm or less, about 500 ppm or less, about 250 ppm or less, about 150 ppm or less, about 120 ppm or less, or about 100 ppm or less of anionic polymeric complexing agents. Alternatively, or in addition, the polishing composition comprises about 10 ppm or more of anionic polymeric complexing agents, for example, about 25 ppm or more, about 50 ppm or more, about 60 ppm or more, or about 75 ppm or more of anionic polymeric complexing agents. Thus, the polishing composition can comprise an amount of anionic polymeric complexing agents bounded by any two of the aforementioned endpoints. For example, the polishing composition can comprise from about 10 ppm to about 1,500 ppm of anionic polymeric complexing agents, for example, about 10 ppm to about 1,000 ppm, about 25 ppm to about 750 ppm, about 50 ppm to about 500 ppm, about 50 ppm to about 250 ppm, about 50 ppm to about 150 ppm, or about 60 ppm to about 120 ppm of anionic polymeric complexing agents.

The anionic polymeric complexing agent can have any suitable molecular weight such that the anionic polymeric complexing agent is compatible with the other components of the polishing composition and results in beneficial polishing properties. In an embodiment, the average molecular weight of the anionic polymeric complexing agent is about 5,000 g/mol.

In an embodiment, the chemical-mechanical polishing composition of the invention can further comprise one or more phosphonic acids. Not wishing to be bound to any particular theory, it is believed that a phosphonic acid acts as a metal chelator in the polishing composition and helps to reduce residue accumulation on the substrate surface and polishing tools. Illustrative phosphonic acids include the DEQUEST™ phosphonates available commercially from Dequest, including DEQUEST™ P9030, DEQUEST™ 2000EG, and DEQUEST™ 2010.

In a preferred embodiment, the phosphonic acid is selected from the group consisting of 1-hydroxyethylidene-1,1-diphosphonic acid, aminotri(methylene)phosphonic acid, nitriloris(methylphosphonic acid), methylphosphonic acid, diethylenetriaminepentakis(methylphosphonic acid), hexamethylenediamine-N,N,N',N'-tetrakis(methylphosphonic acid), iminodi(methylphosphonic acid), (aminomethyl)phosphonic acid, N-(phosphonomethyl)glycine, and mixtures thereof.

The polishing composition can comprise any suitable amount of phosphonic acids. If the amount of phosphonic acids is too low, no beneficial effect is observed. In contrast, if the amount of phosphonic acids is too high, the removal rate of silicon oxides can be reduced. Accordingly, the polishing composition typically comprises about 0.001 wt. % or more, for example, about 0.002 wt. %, about 0.003 wt. %, about 0.004 wt. %, about 0.005 wt. %, about 0.0075 wt. %, about 0.01 wt. %, about 0.05 wt. %, about 0.1 wt. % or more, about 0.2 wt. % or more, or about 0.5 wt. % or more of phosphonic acids. Alternatively, or in addition, the polishing composition can contain about 2 wt. % or less, for example, about 1.5 wt. % or less, or about 1 wt. % or less of phosphonic acids. Thus, the polishing composition can comprise an amount of phosphonic acids bounded by any two of the aforementioned endpoints. For example, the polishing composition can comprise about 0.001 wt. % to about 2 wt. %, 0.002 wt. % to about 1.5 wt. %, or about 0.003 wt. % to about 1 wt. % of phosphonic acids.

In another embodiment, the polishing composition comprises about 1,000 ppm or less of phosphonic acids, e.g. about 900 ppm or less, about 800 ppm or less, about 700 ppm or less, about 600 ppm or less, about 500 ppm or less, about 400 ppm or less, about 300 ppm or less, about 200 ppm or less, or about 100 ppm or less of phosphonic acids.

In an embodiment, the chemical-mechanical polishing composition of the invention further comprises one or more sulfonic acids. Not wishing to bound to any particular theory, it is believed that the sulfonic acid acts to reduce the residue build up on the substrate and polishing tool during polishing. The sulfonic acid desirably is compatible with the other components of the polishing composition. Suitable sulfonic acids include, for example, arylsulfonic acids, aralkyl sulfonic acids, and mixtures thereof. In an embodiment, the sulfonic acid is an arylsulfonic acid. In a preferred embodiment, the arylsulfonic acid is an alkylaryl sulfonic acids. In a particularly preferred embodiment, the alkylaryl sulfonic acid is p-dodecylbenzenesulfonic acid. In another embodiment, the sulfonic acid is an aralkyl sulfonic acid. When the sulfonic acid is an aralkyl sulfonic acid, a particularly preferred aralkyl sulfonic acid is a pyridineethane sulfonic acid. Preferred pyridineethane sulfonic acids include, for example, 4-pyridineethane sulfonic acid and 2-pyridineethane sulfonic acid.

The polishing composition of the invention can comprise any suitable amount of a sulfonic acid to achieve a beneficial result. The polishing composition typically comprises, especially at point-of-use, 50 ppm or more of sulfonic acids, for example, about 100 ppm, or 150 ppm, or about 200 ppm or more of sulfonic acids. Alternatively, or in addition, the polishing composition can comprise about 5,000 ppm or less of sulfonic acids, for example, about 4,000 ppm, about 3,000 ppm, about 2,000 ppm, or about 1,000 ppm or less of sulfonic acids. In an embodiment, the polishing composition comprises about 200 ppm of sulfonic acids, or about 500 ppm, or about 1,000 ppm of sulfonic acids.

In an embodiment, the chemical-mechanical polishing composition of the invention further comprises one or more phosphinocarboxylate polymers. Not wishing to be bound to any particular theory, it is believed that the phosphinocarboxylate polymer acts as a scale inhibitor and dispersant in the polishing composition of the invention. The polishing composition can comprise any suitable amount of phosphinocarboxylate polymers. A particularly preferred phosphinocarboxylate polymer is ACUMER™ 4161 (MW of about 3,300-3,900 g/mol) available commercially from Dow Chemical.

The polishing composition can comprise any suitable amount of phosphinocarboxylate polymers so as to achieve a beneficial result. Typically, the polishing composition of the invention comprises, especially at point-of-use, 10 ppm or more of a phosphinocarboxylate polymer, for example, about 25 ppm or more, 50 ppm or more, about 75 ppm or more, or about 100 ppm or more of phosphinocarboxylate polymers. Alternatively, or in addition, the polishing composition can comprise about 1,000 ppm or less of phosphinocarboxylate polymers, for example, about 750 ppm or less, about 500 ppm or less, about 250 ppm or less, or about 100 ppm or less of phosphinocarboxylate polymers. In an embodiment, the polishing composition comprises about 200 ppm, about 5(X) ppm, or about 1,000 ppm of phosphinocarboxylate polymers.

The polishing composition optionally further comprises one or more biocides. The biocide can be any suitable biocide and can be present in the polishing composition in any suitable amount. A suitable biocide is an isothiazolinone biocide.

The amount of biocide used in the polishing composition typically is about 1 to about 50 ppm, preferably about 10 to about 20 ppm.

The chemical-mechanical polishing composition of the invention desirably has a basic pH. The pH of the polishing composition can be adjusted using any suitable base. In an embodiment, the base is selected from the group consisting of ammonium salts, alkali metal salts, and mixtures thereof. A particularly preferred base is ammonium hydroxide.

In an embodiment, the polishing composition of the invention further comprises polyvinylpyrrolidone. The polyvinylpyrrolidone can have any suitable molecular weight. Desirably, the polyvinylpyrrolidone has a molecular weight such that it exhibits a beneficial effect on the stability of the ceria particles. The polyvinylpyrrolidone can have an average molecular weight of about 10,000 g/mol or higher, for example, about 15,000 g/mol or higher, about 20,000 g/mol or higher, or about 25,000 g/mol or higher. Alternatively, the polyvinylpyrrolidone can have an average molecular weight of about 40,000 g/mol or less, for example, about 35,000 g/mol or less, or about 30,000 g/mol or less. Thus, the polyvinylpyrrolidone can have an average molecular weight bounded by any two of the aforementioned endpoints. For example, the polyvinylpyrrolidone can have an average molecular weight of about 10,000 g/mol to about 40,000 g/mol, and the like.

The polishing composition can comprise any suitable amount of polyvinylpyrrolidone. If the amount of polyvinylpyrrolidone in the polishing composition is too low then no beneficial effect on ceria abrasive stability is obtained. In contrast, if the amount of polyvinylpyrrolidone in the polishing composition is too high, the polishing composition may exhibit undesirable polishing properties and/or may not be cost effective. The polishing composition can comprise about 0.5 wt. % or less of polyvinylpyrrolidone, for example, about 0.4 wt. % or less, about 0.3 wt. or less, about 0.2 wt. % or less, about 0.1 wt. % or less, or about 0.05 wt. % or less of polyvinylpyrrolidone. Alternatively, or in addition, the polishing composition can comprise about 0.001 wt. % or more of polyvinylpyrrolidone, for example, about 0.002 wt. % or more, about 0.01 wt. % or more, about 0.02 wt % or more, about 0.0375 wt. % or more, about 0.05 wt. % or more, about 0.075 wt. % or more, or about 0.1 wt. % or more of polyvinylpyrrolidone. Thus, the polishing composition can comprise polyvinylpyrrolidone in an amount bounded by any two of the aforementioned endpoints. For example, the polishing composition can comprise about 0.01 wt. % to about 0.5 wt. %, about 0.02 wt. % to about 0.4 wt. %, or about 0.0375 wt. % to about 0.3 wt. % of one or more polyvinylpyrrolidone. In an embodiment, the polishing composition comprises about 500 ppm of polyvinylpyrrolidone.

The polishing composition can be produced by any suitable technique, many of which are known to those skilled in the art. The polishing composition can be prepared in a batch or continuous process. Generally, the polishing composition is prepared by combining the components of the polishing composition. The term "component" as used herein includes individual ingredients (e.g., ceria abrasives, lanthanide cations, nonionic polymer, optionally one or more anionic polymeric complexing agents, one or more phosphonic acids, one or more sulfonic acids, one or more phosphinocarboxylate polymers, or one or more biocides, etc.) as well as any combination of ingredients (e.g., ceria abrasives, alkylene oxide containing polymer, etc.).

For example, the polishing composition can be prepared by (i) providing all or a portion of the liquid carrier, (ii) dispersing the ceria abrasive, cations of one or more lanthanide metals, and nonionic polymer(s), along with the one or more optional components (e.g., anionic polymeric complexing agents, phosphonic acid, sulfonic acid, biocides, etc.) using any suitable means for preparing such a dispersion, (iii) adjusting the pH of the dispersion as appropriate, and (iv) optionally adding suitable amounts of any other optional components (e.g., anionic polymeric complexing agent), or combinations thereof to the mixture.

The polishing composition can be supplied as a one-package system comprising a ceria abrasive, cations of one or more lanthanide metals, one or more nonionic polymers, and water. Alternatively, the ceria abrasive can be supplied as a dispersion in a liquid carrier in a first container, and a nonionic polymer can be supplied in a second container, either in dry form, or as a solution or dispersion in the liquid carrier. Optional components, such as, for example, an anionic complexing agent, can be placed in the first and/or second containers or a third container. Furthermore, the components in the first or second container can be in dry form while the components in the corresponding container can be in the form of an aqueous dispersion. Moreover, it is suitable for the components in the first or second containers to have different pH values, or alternatively to have substantially similar, or even equal, pH values. If an optional component such as an anionic polymeric complexing agent is a solid, it may be supplied either in dry form or as a mixture in the liquid carrier. Other two-container, or three or more container, combinations of the components of the polishing composition are within the knowledge of one of ordinary skill in the art.

By way of illustration, the anionic polymeric complexing agent, when present, can be added to the polishing composition in any suitable manner which avoids undesirable effects on colloidal stability of ceria abrasive particles and/or the polishing composition. An illustrative method is adding the anionic polymeric complexing agent to the polishing composition at the point-of-use (e.g., added on the platen of a polishing tool). When the anionic polymeric complexing agent is added at the point-of-use, the interaction time between the lanthanide-treated ceria abrasive particles and the anionic polymeric complexing agent is sufficient enough to result in beneficial polishing properties, but is not so much as to have a negative impact on the colloidal stability of the polishing composition.

In order to mix components contained in storage devices to produce the polishing composition at or near the point-of-use, the storage devices typically are provided with one or more flow lines leading from each storage device to the point-of-use of the polishing composition (e.g., the platen, the polishing pad, or the substrate surface). As utilized herein, the term "point-of-use" refers to the point at which the polishing composition is applied to the substrate surface (e.g., the polishing pad or the substrate surface itself). If the polishing composition is to be produced using point-of-use mixing, the components of the polishing composition are separately stored in two or more storage devices, as appropriate. By the term "flow line" is meant a path of flow from an individual storage container to the point-of-use of the component stored therein. The one or more flow lines can each lead directly to the point-of-use, or, in the case that more than one flow line is used, two or more of the flow lines can be combined at any point into a single flow line that leads to the point-of-use. Furthermore, any of the one or more flow lines (e.g., the individual flow lines or a combined flow line) can first lead to one or more of the other devices (e.g., pumping device, measuring device, mixing device, etc.) prior to reaching the point-of-use of the component(s).

The components of the polishing composition can be delivered to the point-of-use independently (e.g. the components are delivered to the substrate surface whereupon the components are mixed during the polishing process), or the components can be combined immediately before delivery to the point-of-use. Components are combined "immediately before delivery to the point-of-use" if they are combined less than 10 seconds prior to reaching the point-of-use, preferably less than 5 seconds prior to reaching the point-of-use, more preferably less than 1 second prior to reaching the point-of-use, or even simultaneous to the delivery of the components at the point-of-use (e.g., the components are combined at a dispenser). Components also are combined "immediately before delivery to the point-of-use" if they are combined within 5 m of the point-of-use, such as within 1 m of the point-of-use or even within 10 cm of the point-of-use (e.g., within 1 cm of the point-of-use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing slurry are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The polishing composition also can be provided as a concentrate which is intended to be diluted with an appropriate amount of water prior to use. In such an embodiment, the polishing composition concentrate can comprise a ceria abrasive, cations of or more lanthanide metals, one or more nonionic polymers, optionally one or more additives, and water in amounts such that, upon dilution of the concentrate with an appropriate amount of water, each component of the polishing composition will be present in the polishing composition in an amount within the appropriate range recited above for each component. For example, the ceria abrasive, lanthanide cation, nonionic polymer, and optionally an additive can each be present in the concentrate in an amount that is about 2 times (e.g., about 3 times, about 4 times, or about 5 times) greater than the concentration recited above for each component so that, when the concentrate is diluted with an equal volume of water (e.g., 2 equal volumes water, 3 equal volumes of water, or 4 equal volumes of water, respectively), each component will be present in the polishing composition in an amount within the ranges set forth above for each component. Furthermore, as will be understood by those of ordinary skill in the art, the concentrate can contain an appropriate fraction of the water present in the final polishing composition in order to ensure that the ceria abrasive, lanthanide cation, nonionic polymer, and other suitable additives are at least partially or fully dissolved in the concentrate.

The polishing composition of the invention desirably exhibits a high removal rate when polishing a substrate comprising silicon oxide according to a method of the invention. For example, when polishing silicon wafers comprising high density plasma (HDP) oxides and/or plasma-enhanced tetraethyl ortho silicate (PETEOS) and/or tetraethyl orthosilicate (TEOS) in accordance with an embodiment of the invention, the polishing composition desirably exhibits a silicon oxide removal rate of about 500 Å/min or higher, 700 Å/min or higher, about 1,000 Å/min or higher, about 1,250 Å/min or higher, about 1,500 Å/min or higher, about 1,750 Å/min or higher, about 2,000 Å/min or higher, about 2,500 Å/min or higher, about 3,000 Å/min or higher, about 3,500 Å/min or higher. In an embodiment removal rate for silicon oxide can be about 4,000 Å/min or higher, about 4.500 Å/min or higher, or about 5,000 Å/min or higher.

In addition, the chemical-mechanical polishing composition of the invention desirably exhibits a suitable removal rate when polishing a substrate comprising silicon nitride according to a method of the invention. For example, when polishing silicon wafers comprising silicon nitride in accordance with an embodiment of the invention, the polishing composition desirably exhibits a removal rate of the silicon nitride of about 200 Å/min or higher, about 300 Å/min or higher, about 400 Å/min or higher, about 500 Å/min or higher, about 750 Å/min or higher, about 800 Å/min or higher, about 900 Å/min or higher, or about 1,000 Å/min or higher. In other embodiments when the polishing composition comprises a sulfonic acid, the polishing composition desirably exhibits a removal rate of silicon nitride of about 250 Å/min or lower, for example, about 200 Å/min or lower, about 150 Å/min or lower, or even about 100 Å/min or lower.

In addition, the chemical-mechanical polishing composition of the invention desirably exhibits a low removal rate when polishing a substrate comprising polysilicon according to a method of the invention. For example, when polishing silicon wafers comprising polysilicon in accordance with an embodiment of the invention, the polishing composition desirably exhibits a removal rate of polysilicon of about 1,000 Å/min or lower, about 750 Å/min or lower, about 500 Å/min or lower, about 250 Å/min or lower, about 100 Å/min or lower, about 50 Å/min or lower, or 25 Å/min or lower.

Moreover, the polishing composition of the invention desirably exhibits low particle defects when polishing a substrate, as determined by suitable techniques. In a preferred embodiment, the chemical-mechanical polishing composition of the invention desirably comprises a wet-process ceria which contributes to the low defectivity. Particle defects on a substrate polished with the inventive polishing composition can be determined by any suitable technique. For example, laser light scattering techniques, such as dark field normal beam composite (DCN) and dark field oblique beam composite (DCO), can be used to determine particle defects on polished substrates. Suitable instrumentation for evaluating particle defectivity is available from, for example, KLA-Tencor (e.g., SURFSCAN™ SP1 instruments operating at a 120 nm threshold or at 160 nm threshold).

A substrate, especially silicon comprising silicon oxide and/or silicon nitride and/or polysilicon, polished with the inventive polishing composition desirably has a DCN value of about 20,000 counts or less, e.g., about 17,500 counts or less, about 15,000 counts or less, about 12,500 counts or less, about 3,500 counts or less, about 3,000 counts or less, about 2,500 counts or less, about 2.000 counts or less, about 1,500 counts or less, or about 1,000 counts or less. Preferably substrates polished in accordance with an embodiment of the invention has a DCN value of about 750 counts or less, about 5(X) counts, about 250 counts, about 125 counts, or even about 100 counts or less. Alternatively, or in addition, the chemical-mechanical polishing composition of the invention desirably exhibits low scratches when polishing a substrate, as determined by suitable techniques. For example, silicon wafers polished in accordance with an embodiment of the invention desirably comprise about 250 scratches or less, or about 125 scratches or less, as determined by any suitable method known in the art.

The polishing composition of the invention can be tailored to provide effective polishing at the desired polishing ranges selective to specific thin layer materials, while at the same time minimizing surface imperfections, defects, corrosion, erosion and the removal of stop layers. The selectivity can be controlled, to some extent, by altering the relative concentrations of the components of the polishing composition. When desirable, the method of the invention can be used to polish a substrate with a silicon dioxide to polysilicon polishing selectivity of about 5:1 or higher (e.g., about 10:1 or higher, about 15:1 or higher, about 25:1 or higher, about 50:1 or higher, about 100:1 or higher, or about 150:1 or even higher). Also, the method of the invention can be used to polish a substrate with a silicon nitride to polysilicon polishing selectivity of about 2:1 or higher (e.g., about 4:1 or higher, or about 6:1 or higher). Certain formulations can exhibit even higher silicon dioxide to polysilicon selectivities, such as about 20:1 or higher, or even about 30:1 or higher. In a preferred embodiment, the method of the invention simultaneously provides selective polishing of silicon dioxide and silicon nitride relative to polysilicon.

The invention also provides a method of chemically-mechanically polishing a substrate comprising (i) contacting a substrate with a polishing pad and the chemical-mechanical polishing composition as described herein, (ii) moving the polishing pad relative to the substrate with the chemical-mechanical polishing composition therebetween, and (iii) abrading at least a portion of the substrate to polish the substrate.

The chemical-mechanical polishing composition can be used to polish any suitable substrate and is especially useful for polishing substrates comprising at least one layer (typically a surface layer) comprised of a low dielectric material. Suitable substrates include wafers used in the semiconductor industry. The wafers typically comprise or consist of, for example, a metal, metal oxide, metal nitride, metal composite, metal alloy, a low dielectric material, or combinations thereof. The method of the invention is particularly useful for polishing substrates comprising silicon oxide, silicon nitride, and/or polysilicon, e.g., any one, two, or especially all three of the aforementioned materials. For example, the polishing composition can be used to polish silicon wafers used in the electronics industry. In this regard, the silicon can be undoped silicon, or it can be p-type silicon doped with boron or aluminum. In addition, the silicon can be polysilicon.

The substrate desirably comprises polysilicon in combination with silicon oxide and/or silicon nitride. The polysilicon can be any suitable polysilicon, many of which are known in the art. The polysilicon can have any suitable phase, and can be amorphous, crystalline, or a combination thereof. The silicon oxide similarly can be any suitable silicon oxide, many of which are known in the art. Suitable types of silicon oxide include but are not limited to borophosphosilicate glass (BPSG), PETEOS, thermal oxide, undoped silicate glass, and HDP oxide. Other suitable metal oxides include partially-stabilized zirconia (PSZ).

Advantageously, silicon substrates polished using the inventive polishing method exhibit low surface roughness and low particle defectivity. Surface roughness ($R_a$), which is defined herein as the arithmetical mean of deviations from planarity, can be measured using any suitable technique. Suitable techniques include stylus profilometry and optical profilometry, using instruments available from, e.g., Veeco Instruments (Plainview, N.Y.), as well as atomic force microscopy. Typically, the inventive polishing method produces a surface roughness on silicon wafers of about 20 Å or less (e.g., about 14 Å or less, or about 12 Å or less, or about 10 Å or less, or even about 8 Å or less), when measured using an optical profilometer.

The polishing composition and method of the invention are particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the polishing composition of the invention, and then the polishing pad moving relative to the substrate, so as to abrade at least a portion of the substrate to polish the substrate.

A substrate can be polished with the chemical-mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof. Soft polyurethane polishing pads are particularly useful in conjunction with the inventive polishing method. Typical pads include but are not limited to SURFIN™ 000, SURFIN™ SSW1, SPM3100 (commercially available from, for example, Eminess Technologies), POLITEX™, and Fujibo POLYPAS™ 27. A particularly preferred polishing pad is the EPIC™ D100 pad commercially available from Cabot Microelectronics.

Desirably, the chemical-mechanical polishing apparatus further comprises an in situ polishing endpoint detection system, many of which are known in the art. Techniques for inspecting and monitoring the polishing process by analyzing light or other radiation reflected from a surface of the substrate being polished are known in the art. Such methods are described, for example, in U.S. Pat. Nos. 5,196,353, 5,433, 651, 5,609,511, 5,643,046, 5,658,183, 5,730,642, 5,838,447, 5,872,633, 5,893,796, 5,949,927, and 5,964,643, Desirably, the inspection or monitoring of the progress of the polishing process with respect to a substrate being polished enables the determination of the polishing end-point, i.e., the determination of when to terminate the polishing process with respect to a particular substrate.

EXAMPLES

These following examples further illustrate the invention but, of course, should not be construed as in any way limiting its scope.

The following abbreviations are used throughout the Examples: removal rate (RR); tetraethyl orthosilicate (TEOS); silicon nitride (SiN); polysilicon (polySi); molecular weight (MW); lanthanide metal (LN); anionic polymeric complexing agent (APCA); phosphonic acid (PA); sulfonic acid (SA); phosphinocarboxylate polymer (PCP); acrylamide polymer (AA); polyacrylic acid (PAA); polyacrylamide (PAM); polymethylacrylamide (PMA); polyethylene glycol (PEG); polyvinypyrrolidone (PVP); plasma enhanced tetraethyl orthosilicate (PETEOS); silicon nitride (SiN); high density plasmas (HDP); partially stabilized zirconium (PSZ); PLURONIC™ L31 (L3): DEQUEST™ P9030 (P9030); DEQUEST™ 2000EG (D-2000EG); DEQUEST™ 2010; (D-2010); ACUMER™ 4161 (A-4161); SURFYNOL™ 485 (S-485); p-dodecylbenzylsulfonic acid (DBSA); 2-pyridineethanesulfonic acid (2-PESA); 4-pyridineethanesulfonic acid (4-PESA): saturated (satd.).

Example 1

This example demonstrates that polishing compositions of the invention, which comprise a wet-process ceria abrasive, cations of one or more lanthanide metals, an alkylene oxide containing polymer, an anionic polymeric complexing agent, and water, exhibit an improved removal rate on TEOS.

Silicon wafers comprising TEOS were polished using an EPIC™ D100 pad (CMC groove) commercially available from Cabot Microelectronics under the same conditions with 3 different polishing compositions identified as Polishing Compositions 1A-1C. The polishing compositions were prepared as concentrates containing 5 wt. % solids and were diluted at point-of-use. Each of the Polishing Compositions 1A-1C contained, at point-of-use, 0.4 wt. % wet-process ceria, 2,000 ppm of PLURONIC™ L31 surfactant, 120 ppm of polyacrylic acid, water, and the lanthanide nitrate salt indicated in Table 1. Lanthanide nitrate salts were added to the polishing composition concentrates to obtain a lanthanide cation concentration of 1,000 ppm. The lanthanide cation concentration at point-of-use was 100 ppm. Comparative Polishing Composition C1 contained, at point-of-use, 0.4 wt. % wet-process ceria, 2,000 ppm of PLURONIC™ L31 surfactant, 120 ppm of polyacrylic acid, and water. The pH of each polishing composition was adjusted to 8.3-9.0. The flow rate of the polishing composition during the polishing process was 100 mL/min.

The TEOS removal rate was determined for each polishing composition, and the results are set forth in Table 1.

TABLE 1

| Comp. | LN | LN Atomic No. | TEOS RR (Å/min) |
|---|---|---|---|
| C1 | none | none | 365 |
| 1A | Nd(NO$_3$)$_3$ | 60 | 375 |
| 1B | Gd(NO$_3$)$_3$ | 64 | 460 |
| 1C | Ho(NO$_3$)$_3$ | 67 | 510 |

As is apparent from the results set forth in Table 1, a polishing composition comprising a wet-process ceria, lanthanide cations, PLURONIC™ L31 surfactant, polyacrylic acid, and water exhibits an increased removal rate on TEOS as compared to a similar polishing composition without the lanthanide cations. Moreover, a higher atomic number of the lanthanide metal correlated with a higher TEOS removal rate.

Example 2

This example demonstrates that polishing compositions of the invention, which comprise a wet-process ceria abrasive, cations of one or more lanthanide metals, an alkylene oxide containing polymer, and water, can exhibit a high removal rate on TEOS.

Silicon wafers comprising TEOS were polished using a MIRRA™ tool commercially available from Applied Materials and an EPIC™ D100 pad (CMC groove) commercially available from Cabot Microelectronics under the same conditions with 12 different polishing compositions identified as Polishing Compositions 2A-2L. Each of the Polishing Compositions 2A-2L contained, at point-of-use, 0.4 wt. % wet-process ceria (HC-60™), 2000 ppm of PLURONIC™ L31 surfactant, water, and the lanthanide nitrate salt indicated in Table 2. Lanthanide nitrate salts were added to the polishing composition to obtain a cation concentration of 250 ppm, 500 ppm, or 1,500 ppm, as indicated in Table 2. The pH of the polishing compositions was adjusted to 8.3 with ammonium hydroxide (29%). The flow rate of the polishing composition during the polishing process was 150 mL/min. The silicon wafers contacted the polishing pad with a downforce of 20.7 kPa (3 psi).

The TEOS removal rate and average ceria particle size were determined for each polishing composition. The particle size data was determined using a HORIBA™ tool commercially available from Horiba. The larger particle sizes found in Polishing Compositions 2A, 2D, 2E, 2G, 2J were a result of particle aggregation in polishing compositions having different colloidal stability. The removal rate and particle size data are set forth in Table 2.

TABLE 2

| Comp. | LN (ppm) | TEOS RR (Å/min) | Particle Size (nm) |
|---|---|---|---|
| 2A | La(NO$_3$)$_3$ (250) | 1600 | 6023 |
| 2B | La(NO$_3$)$_3$ (500) | 1565 | 98 |
| 2C | La(NO$_3$)$_3$ (1500) | 2240 | 95 |
| 2D | Nd(NO$_3$)$_3$ (250) | 1635 | 6031 |
| 2E | Nd(NO$_3$)$_3$ (500) | 1895 | 1340 |
| 2F | Nd(NO$_3$)$_3$ (1500) | 495 | 95 |
| 2G | Er(NO$_3$)$_3$ (250) | 1140 | 5000 |
| 2H | Er(NO$_3$)$_3$ (500) | 1435 | 105 |
| 2I | Er(NO$_3$)$_3$ (1500) | 1395 | 93 |
| 2J | Yb(NO$_3$)$_3$ (250) | 1390 | 5250 |
| 2K | Yb(NO$_3$)$_3$ (500) | 1625 | 109 |
| 2L | Yb(NO$_3$)$_3$ (1500) | 1025 | 94 |

As is apparent from the results set forth in Table 2, polishing compositions comprising a wet-process ceria, cations of lanthanide metals, an alkylene oxide containing polymer, and water can exhibit a high removal rate on TEOS. Also, the particle size of the ceria abrasive particles was inversely proportional to the lanthanide concentration, such that, for each group of polishing compositions, the composition containing 250 ppm of lanthanide had the largest particle size, and the composition containing 1500 ppm of lanthanide had the smallest particle size.

Example 3

This example demonstrates that polishing compositions of the invention, which comprise a wet-process ceria abrasive, cations of a lanthanide metals, an alkylene oxide containing polymer, and water, exhibit an improved removal rate on PETEOS and SiN.

Silicon wafers (200 mm) comprising either PETEOS or SiN were polished (3 mm edge exclusion) using a MIRRA™ tool commercially available from Applied Materials and an EPIC™ D100 pad (CMC groove) commercially available from Cabot Microelectronics under the same conditions with 2 different polishing compositions identified as Polishing Compositions 3A and 3B. Each of the Polishing Compositions 3A and 3B contained, at point-of-use, 0.4 wt. % wet-process ceria, 2000 ppm of PLURONIC™ L31 surfactant, water, and 200 ppm of the lanthanide indicated in Table 3. Comparative Polishing Composition C2 contained 0.4 wt. % wet-process ceria, 2000 ppm of PLURONIC™ L31 surfactant, and water. The pH of each polishing composition was adjusted to 8.3 with ammonium hydroxide (29%). The flow rate of the polishing composition during the polishing process was 150 mL % min. The silicon wafers contacted the polishing pad with a downforce of 20.7 KPa (3 psi). The polishing composition also included SAESOL™ S80 conditioner.

The TEOS and SiN removal rates were determined for each polishing composition and are set forth in Table 3.

TABLE 3

| Comp. | LN | PETEOS RR (Å/min) | SiN RR (Å/min) |
|---|---|---|---|
| C2 | None | 1524 | 246 |
| 3A | La(NO$_3$)$_3$ | 3398 | 827 |
| 3B | Yb(NO$_3$)$_3$ | 2453 | 707 |

As is apparent from the results set forth in Table 3, polishing compositions containing a wet-process ceria, cations of one or more lanthanide metals, an alkylene oxide containing polymer, and water can exhibit an increased removal rate on PETEOS and SiN.

Example 4

This example demonstrates that polishing compositions of the invention, which comprise a wet-process ceria abrasive, cations of a lanthanide metal, nonionic polymers (i.e., an alkylene oxide containing polymer and an acrylamide polymer), and water, can exhibit a high removal rate on TEOS and SiN and a lower removal rate on polySi.

A silicon wafer (200 mm) comprising PETEOS, SiN, and polySi was polished (3 mm edge exclusion) using a MIRRA™ tool commercially available from Applied Materials and a IC1010™ pad commercially available from Rohm and Haas with Polishing Composition 4A. Polishing Composition 4A contained, at point-of-use, 0.4 wt. % wet-process ceria, 80 ppm of La(NO$_3$)$_3$, 2000 ppm of PLURONIC™ L31, 60 ppm polyacrylamide, SAESOL™ S80 conditioner, and water. The pH of the polishing composition was adjusted to 8.3 with ammonium hydroxide (29%). The flow rate of the polishing composition during the polishing process was 150 mL/min. The silicon wafer contacted the polishing pad with a downforce of 20.7 KPa (3 psi).

The removal rate for TEOS, SiN, and polySi was determined for the polishing composition and is set forth in Table 4.

TABLE 4

| Comp. | TEOS RR (Å/min) | SiN RR (Å/min) | polySi RR (Å/min) |
|---|---|---|---|
| 4A | 3416 | 799 | 155 |

As is apparent from the results set forth in Table 4, polishing compositions containing a wet-process ceria, lanthanum cations, an alkylene oxide containing polymer, an acrylamide polymer, and water exhibit a high removal rate on PETEOS and SiN and a lower removal rate on polySi.

Example 5

This example demonstrates that polishing compositions of the invention, which comprise a wet-process ceria abrasive, cations of a lanthanide metals, an acrylamide polymer, and water, exhibit improved polishing properties, including a higher removal rate on TEOS.

Silicon wafers (200 mm) comprising TEOS, SiN, and polySi were polished using an EPIC™ D100 pad (CMC groove) commercially available from Cabot Microelectronics under the same conditions with 6 different polishing compositions identified as Polishing Compositions 5A-5F. The polishing compositions were prepared as concentrates containing 2.5 wt. % solids and were diluted to 0.4 wt. % solids at point-of-use. Each of Polishing Compositions 5A-5F contained, at point-of-use, 0.4 wt. % wet-process ceria, lanthanum cations, and polyacrylamide as indicated in Table 5, and water. Lanthanum nitrate was added to the polishing compositions to obtain the lanthanide cation concentrations indicated in Table 5. Comparative Polishing Composition C3 contained, as a concentrate, 1500 ppm of polyacrylic acid, and 2.5 wt. % wet-process ceria, which was then diluted to 0.4 wt. % at point-of-use, followed by the addition of 500 ppm PLURONIC™ L31. The pH of each polishing compositions was adjusted to 8.3-9.0. The flow rate of the polishing composition during the polishing process was 100 mL/min.

The TEOS removal rates were determined for each polishing composition, and the results are set forth in Table 5.

TABLE 5

| Comp. | La(NO$_3$)$_3$ (ppm) | PAM[1] (ppm) | TEOS RR (Å/min) |
|---|---|---|---|
| C3 | none | 0 | 315 |
| 5A | 1000 | 250 | 1745 |
| 5B | 500 | 250 | 1705 |
| 5C | 750 | 375 | 1690 |
| 5D | 500 | 500 | 1760 |
| 5E | 1000 | 500 | 1690 |
| 5F | 500 | 375 | 1640 |

[1]Polishing Composition C3 contained 500 ppm PAA

As is apparent from the results set forth in Table 5, polishing compositions containing a wet-process ceria, lanthanum nitrate, polyacrylamide, and water exhibit a higher TEOS removal rate.

Example 6

This example demonstrates that polishing compositions of the invention, which comprise a wet-process ceria abrasive, cations of one or more lanthanide metals, one or more alkylene oxide containing polymers, optionally one or more anionic polymeric complexing agents, optionally one or more phosphonic acids, optionally one or more phosphinocarboxylate polymers, and water, can exhibit good overall substrate polishing properties, including a high removal rate of TEOS and SiN and a lower removal rate of polySi. Moreover, this example also demonstrates that polishing compositions of the invention can be mixed at point-of-use and exhibit good substrate polishing properties.

Silicon wafers (200 mm) comprising TEOS, SiN, and polySi were polished (3 mm edge exclusion) using a MIRRA™ tool commercially available from Applied Materials and a IC1010™ pad commercially available from Rohm and Haas under the same conditions with 4 different polishing compositions identified as Polishing Compositions 6A-6D, which were prepared from mixing components "A" and "B" on the platen at point-of-use.

Component A was identical for each polishing composition and contained, as a concentrate, (a) 2.5 wt. % of HC-60™ wet-process ceria commercially available from Rhodia, (b) 500 ppm La(NO3)3, (c) 1,500 ppm PEG (10,000 MW), and (d) water.

Component B contained (a) PLURONIC™ L31 surfactant (4,000 ppm), (b) one or more of polyacrylamide (5,000 MW), polymethylacrylamide, ACUMER™ 4161 phosphinopolycarboxylate polymer, and DEQUEST™ 2000EG phosphonate, as indicated in Table 6, and (c) water.

Components A and B were mixed 1:1 by volume on the platen using a flow rate of 100 mL/min to form polishing compositions having 0.8 wt. % solids at point-of-use. The pH of each polishing composition was adjusted to 9.0 using ammonium hydroxide. Comparative Composition C4 contained only deionized water.

TABLE 6

| Comp. | APCA (ppm) | PCP(ppm) | PA (ppm) |
|---|---|---|---|
| C4 | none | none | none |
| 6A | PAA[1] (60) | none | none |
| 6B | PMA[2] (60) | none | none |
| 6C | none | A4161 (60) | none |
| 6D | PAA[1] (60) | none | D2000EG (80) |

[1]5,000 MW PAA
[2]9,500 MW PMA

The TEOS, SiN, and polySi removal rates were determined for each polishing composition, and the results are set forth in Table 7. In addition, the selectivity of each of the polishing compositions is also set forth in Table 7.

TABLE 7

| Comp. | TEOS RR (Å/min) | SiN RR (Å/min) | polySi RR (Å/min) | TEOS:polySi ratio | SiN:polySi ratio |
|---|---|---|---|---|---|
| C4 | 5059 | 824 | 76 | 66.6 | 10.8 |
| 6A | 4037 | 290 | 25 | 161.5 | 11.6 |
| 6B | 4712 | 465 | 27 | 174.5 | 17.2 |
| 6C | 3998 | 354 | 18 | 222.1 | 19.7 |
| 6D | 3198 | 422 | 12 | 266.5 | 35.2 |

As is apparent from the results set forth in Tables 6 and 7, polishing compositions comprising a wet-process ceria abrasive, lanthanum cations, one or more alkylene oxide containing polymers, optionally one or more anionic polymeric complexing agents, optionally one or more phosphonic acids, optionally one or more phosphinocarboxylate polymers, and water, can exhibit good overall substrate polishing properties, including a removal rate of TEOS as high as about 4,700 Å/min and a removal rate on SiN as high as about 475 Å/min. The polishing compositions also exhibit a removal rate of polySi as low as about 10 Å/min. In addition, each of Polishing Composition 6A-6D exhibited an improved selectivity of TEOS and SiN over polySi. For example, Polishing Composition 6D exhibited a 4-fold increase in TEOS:polySi selectivity and more than a 3-fold increase in SiN:polySi selectivity.

Example 7

This example demonstrates that polishing compositions of the invention, which comprise a ceria abrasive, lanthanum cations, one or more alkylene oxide containing polymers, one or more anionic polymeric complexing agents, optionally one or more phosphonic acids, and water, can exhibit good overall substrate polishing properties, including a high removal rate of TEOS and SiN, a lower removal rate of polySi, and good particle defectivity. Moreover, this example also demonstrates that polishing compositions of the invention can be mixed at point-of-use and exhibit good substrate polishing properties.

Silicon wafers (200 mm) comprising TEOS, SiN, and polySi were polished (3 mm edge exclusion) using a MIRRA™ tool commercially available from Applied Materials and an EPIC™ D100 pad (CMC groove) commercially available from Cabot Microelectronics under the same conditions with 7 different polishing compositions identified as Polishing Compositions 7A-7G containing components "A" and "B" which were prepared by mixing components A and B on the platen at point-of-use in a manner as described in Example 6.

Component A was identical to polishing component of Example 6. Component B contained (a) PLURONIC™ L31 surfactant (4000 ppm), (b) polymethylacrylamide, (c) either DEQUEST™ 2010 phosphonate or SURFYNOL™ 485 surfactant, as indicated in Table 8, and (d) water. Components A and B were mixed 1:1 by volume on the platen using a flow rate of 100 mL/min to form polishing compositions having 0.8 wt. % solids at point-of-use. The pH of each polishing composition was adjusted to 9.0 using ammonium hydroxide.

TABLE 8

| Comp. | Component B[1] | | |
|---|---|---|---|
| | PMA (ppm) | D2010(ppm) | S485 (ppm) |
| 7A | 60 | none | none |
| 7B | 120 | none | none |
| 7C | 250 | none | none |
| 7D | 60 | 80 | none |
| 7E | 60 | none | 40 |
| 7F | 60 | none | 100 |
| 7G | 60 | none | 250 |

[1]Component B contained 4000 ppm of PLURONIC ™ L31 surfactant

The TEOS, SiN, and polySi removal rates were determined for each polishing composition. The defectivity was determined for each substrate after polishing using a SURFSCAN™ SP1 wafer surface analysis instrument available from KLA-Tencor operating at a threshold of 120 nm. The results are set forth in Table 9.

TABLE 9

| Comp. | TEOS RR (Å/min) | SiN RR (Å/min) | polySi RR (Å/min) | SP1 (counts) |
|---|---|---|---|---|
| 7A | 3763 | 700 | 50 | 446 |
| 7B | 3494 | 694 | 41 | 118 |
| 7C | 2959 | 680 | 38 | 150 |
| 7D | 1527 | 506 | 18 | 603 |
| 7E | 3681 | 774 | 51 | 371 |
| 7F | 3298 | 738 | 51 | 389 |
| 7G | 3019 | 758 | 56 | 231 |

As is apparent from the results set forth in Tables 8 and 9, polishing compositions comprising a wet-process ceria abrasive, lanthanum cations, one or more alkylene oxide containing polymers, one or more anionic polymeric complexing agents, optionally one or more phosphonic acids, and water, can exhibit good overall substrate polishing properties, including a TEOS removal rate as high as about 3800 Å/min and a SiN removal rate as high as about 800 Å/min. The polishing compositions also exhibit a polySi removal rate as low as about 20 Å/min. Moreover, the polishing compositions exhibited SP1 defectivity as low as about 100 counts.

Example 8

This example demonstrates that polishing compositions of the invention, which comprise a ceria abrasive, lanthanum cations, one or more alkylene oxide containing polymers, one or more anionic polymeric complexing agents, and water, can exhibit good overall substrate polishing properties, including a high removal rate of TEOS and SiN, a lower removal rate of polySi, and good particle defectivity on 300 mm silicon wafers. Moreover, this example also demonstrates that polishing compositions of the invention can be mixed at point-of-use and exhibit good substrate polishing properties.

Silicon wafers (300 mm) comprising TEOS, SiN, and polySi were polished (3 mm edge exclusion) using a REFLEXION™ tool commercially available from Applied Materials and a IC1010™ pad commercially available from Rohm and Haas under the same conditions with 4 different polishing compositions identified as Polishing Compositions 8A-RD containing components "A" and "B" which were prepared by mixing components A and B on the platen at point-of-use in a manner as described in Example 6.

Component A was identical to the component A of Example 6. Component B contained (a) PLURONIC™ L31 surfactant (4,000 ppm), (b) polymethylacrylamide, (c) optionally SURFYNOL™ 485 surfactant, as indicated in Table 10, and (d) water. Components A and B were mixed 1:1 by volume on the platen using a flow rate of either 125 or 250 mL/min to form polishing compositions having 0.8 wt. % solids at point-of-use. The pH1 of polishing compositions was adjusted to 9.0 using ammonium hydroxide. The silicon wafers contacted the polishing pad with a downforce of 15.2 KPa (2.2 psi).

TABLE 10

| Comp. | Component B[1] | |
|---|---|---|
| | PMA (ppm) | S485 (ppm) |
| 8A | 120 | none |
| 8B | 240 | none |
| 8C | 120 | 100 |
| 8D | 240 | 100 |

[1]Component B contained 4000 ppm of PLURONIC ™ L31 surfactant

The TEOS, SiN, and polySi removal rates were determined for each polishing composition, and the results are set forth in Table 11. In addition, the SP1 defectivity was determined for Polishing Composition 8A, and the results are set forth in Table 12.

TABLE 11

| Comp. | TEOS RR (Å/min) | SiN RR (Å/min) | polySi RR (Å/min) |
|---|---|---|---|
| 8A | 2604 | 721 | 27 |
| 8B | 2404 | 679 | 24 |
| 8C | 2570 | 727 | 27 |
| 8D | 2284 | 683 | 23 |

TABLE 12

| SP1 DCN defects | Comp. 8A |
|---|---|
| total counts | 438 |
| small particle | 270 |
| large particle/residue | 19 |
| scratch | 131 |

As is apparent from the results set forth in Tables 10 and 11, polishing compositions comprising a wet-process ceria abrasive, lanthanum cations, one or more alkylene oxide containing polymers, one or more anionic polymeric complexing agents, and water can exhibit good overall substrate polishing properties, including a removal rate of TEOS as high as about 3000 Å/min and a removal rate on SiN as high as about 750 Å/min. The polishing compositions also exhibit removal rate of polySi as low as about 20 Å/min.

As is apparent from the results set forth in Table 12, Polishing Composition 8A exhibits suitable defectivity properties when used to polish 300 mm wafers, including total counts of about 425, small particle counts of 270, residue counts of about 20, and scratch counts of about 125.

Example 9

This example demonstrates that polishing compositions of the invention, which comprise a ceria abrasive, lanthanum cations, one or more alkylene oxide containing polymers, one or more anionic polymeric complexing agents, one or more phosphonic acids, and water, can exhibit good overall substrate polishing properties, including a high removal rate of TEOS and SiN, a lower removal rate of polySi, and good particle defectivity on 300 mm silicon wafers. Moreover, this example demonstrates that polishing compositions of the invention can be mixed at point-of-use and exhibit good substrate polishing properties.

Silicon wafers (300 mm) comprising HDP, PSZ, SiN, and polySi were polished (3 mm edge exclusion) using a REFLEXION™ tool commercially available from Applied Materials and a IC1010™ pad commercially available from Rohm and Haas under the same conditions with 3 different polishing compositions identified as Polishing Compositions 9A-9C containing components "A" and "B" which were prepared by mixing components "A" and "B" on the platen at point-of-use in a manner as described in Example 6.

Component A was similar to component A of Example 6, but further contained either 60 ppm or 80 ppm of DEQUEST™ 2010 or DEQUEST™ 2000EG phosphonates as indicated in Table 13. Component B was identical to component B of Example 8. Components A and B were mixed 1:1 by volume on the platen using a flow rate of either 125 or 250 mL/min to form polishing compositions having 0.8 wt. % solids at point-of-use. The pH of each polishing composition was adjusted to 9.0 using ammonium hydroxide. The silicon wafers contacted the polishing pad with a downforce of 15.2 kPa (2.2 psi).

The HDP/PSZ, SiN, and polySi removal rates were determined for each polishing composition, and the results are set forth in Table 13.

TABLE 13

| Comp. | PA (ppm) | HDP/PSZ RR (Å/min) | SiN RR (Å/min) | polySi RR (Å/min) |
|---|---|---|---|---|
| 9A | DEQUEST™ 2000 (80) | 2128 | 422 | 2 |
| 9B | DEQUEST™ 2000 (60) | 2285 | 508 | 7 |
| 9C | DEQUEST™ 2010 (60) | 1971 | 353 | 12 |

As is apparent from the results set forth in Table 13, Polishing Compositions 9A-9C containing a ceria abrasive, lanthanum cations, one or more alkylene oxide containing polymers, one or more anionic polymeric complexing agents, one or more phosphonic acids, and water, can exhibit good overall substrate polishing properties, including a HDP/PSZ removal rate as high as about 2300 Å/min, a SiN removal rate as high as about 500 Å/min, and a removal rate of polySi near 0 Å/min.

Example 10

This example demonstrates that polishing compositions of the invention, which comprise a ceria abrasive, lanthanum cations, one or more alkylene oxide containing polymers, one or more phosphonic acids, and water, can exhibit good overall substrate polishing properties, including a suitable removal rate of TEOS and good particle defectivity on 3(X) mm silicon wafers. Moreover, this example also demonstrates that polishing compositions of the invention can be mixed at point-of-use and exhibit good substrate polishing properties.

Silicon wafers (300 mm) comprising TEOS were polished (3 mm edge exclusion) using a REFLEXION™ tool commercially available from Applied Materials and a IC1010™ pad commercially available from Rohm and Haas with Polishing Composition 10A containing, as a concentrate, 2.5 wt. % HC-60™ wet-process ceria, 250 ppm of La(NO$_3$)$_3$ hexahydrate, 750 ppm of PEG (10,000 MW), and 125 ppm of DEQUEST™ 2000EG phosphonate. The concentrate was diluted to 0.4 wt. % solids for polishing. PLURONIC™ L31 surfactant (500 ppm) was added at point-of-use.

The SP1 (160 nm) defectivity on TEOS containing substrates was determined, and the results are set forth in Table 14.

TABLE 14

| SP1 DCN defects | Comp. 10A |
|---|---|
| unclassified | 686 |
| small particle | 189 |
| large particle | 377 |
| scratch | 131 |

As is apparent from the results set forth in Table 14, Polishing Composition 10A exhibits suitable defectivity properties when used to polish 300 mm wafers, including a small particle count of about 190 and a scratch count of about 125.

Example 11

This example demonstrates that polishing compositions of the invention, which comprise a ceria abrasive, cations of one or more lanthanide metals, one or more alkylene oxide containing polymers, optionally one or more anionic polymeric complexing agents, optionally one or more phosphonic acids, optionally one or more phosphinocarboxylate polymers, optionally one or more sulfonic acids, and water, can exhibit good overall substrate polishing properties, including exhibiting a high removal rate of TEOS and SiN and a lower removal rate of polySi. Moreover, this example demonstrates that polishing compositions of the invention can be mixed at point-of-use and exhibit good substrate polishing properties.

Silicon wafers (300 mm) comprising TEOS, SiN, and polySi were polished (3 mm edge exclusion) using a REFLEXION™ tool commercially available from Applied Materials and an EPIC™ D100) pad (CMC groove) commercially available from Cabot Microelectronics under the same conditions with 3 different polishing compositions identified as Polishing Compositions 11A-11C, which were prepared by mixing components "A" and "B" on the platen at point-of-use as described previously.

Component A was similar to component A of Example 6, but further contained p-dodecylbenzylsulfonic acid, as indicated in Table 15. Component B was identical to component B of Example 6. Comparative Polishing Composition C5 did not contain p-dodecylbenzylsulfonic acid. Components A and B were mixed 1:1 by volume on the platen as described previously using a flow rate of 1(X) mL/min to form polishing compositions having 0.8 wt. % solids at point-of-use. The pH of each polishing composition was adjusted to 9.0 using ammonium hydroxide.

The TEOS, SiN, and polySi removal rates were determined for each polishing composition, and the results are set forth in Table 15.

TABLE 15

| Comp. | DBSA (ppm) | TEOS RR (Å/min) | SiN RR (Å/min) | polySi RR (Å/min) |
|---|---|---|---|---|
| C5 | 0 | 3264 | 698 | 32 |
| 11A | 200 | 1719 | 132 | 36 |
| 11B | 500 | 1887 | 113 | 41 |
| 11C | 1000 | 1858 | 86 | 27 |

As is apparent from the results set forth in Table 15, polishing compositions containing a wet-process ceria abrasive, lanthanum cations, one or more alkylene oxide containing polymers, optionally one or more anionic polymeric complexing agents, optionally one or more phosphonic acids, optionally one or more phosphinocarboxylate polymers, a sulfonic acid, and water can exhibit good overall substrate polishing properties, including a TEOS removal rate as high as about 3300 Å/min and a SiN removal rate as low as about 85 Å/min. In addition, this example demonstrates that polishing compositions of the invention containing p-dodecylbenzylsulfonic acid can exhibit a lower SiN removal rate. The polySi removal rate was as low as about 25 Å/min. Moreover, this example demonstrates that polishing compositions of the invention can be mixed at point-of-use and exhibit good substrate polishing properties.

Example 12

This example demonstrates that polishing compositions of the invention, which comprise a ceria abrasive, cations of one or more lanthanide metals, one or more alkylene oxide containing polymers, optionally one or more anionic polymeric complexing agents, optionally one or more phosphonic acids, optionally one or more phosphinocarboxylate polymers, optionally one or more sulfonic acids, and water, can exhibit good overall substrate polishing properties, including exhibiting a high removal rate of TEOS and SiN and a lower removal rate of polySi. Moreover, this example demonstrates that polishing compositions of the invention can be mixed at point-of-use and exhibit good substrate polishing properties.

Silicon wafers (200 mm) comprising TEOS, SiN, and polySi were polished (3 mm edge exclusion) using a MIRRA™ tool commercially available from Applied Materials and an EPIC™ D100 pad (CMC groove) commercially available from Cabot Microelectronics under the same conditions with 3 different polishing compositions identified as Polishing Compositions 12A-12C. Each of Polishing Compositions 12A-12C contained, as concentrates, 2.5 wt. % HC-60™ M wet-process ceria, 250 ppm La(NO$_3$)$_3$, 750 ppm of PEG (10,000 MW), and either 2-pyridineethanesulfonic acid or 4-pyridineethanesulfonic acid as indicated in Table 16, and water. The concentrates were diluted to contain 0.4 wt. % solids at point-of-use. PLURONIC™ L31 surfactant (500 ppm) was added at point-of-use. Comparative Polishing Composition C6 did not contain a sulfonic acid.

The TEOS, SiN, and polySi removal rates were determined, and the results are summarized in Table 16.

TABLE 16

| Comp. | SA (ppm) | TEOS RR (Å/min) | SiN RR (Å/min) | polySi RR (Å/min) | DCN (0.16) | DCN (0.12) |
|---|---|---|---|---|---|---|
| C6 | 0 | 2592 | 485 | 33 | 624 | satd. |
| 12A | 2-PESA (100) | 2449 | 820 | 115 | 2181 | 16900 |
| 12B | 2-PESA (500) | 3023 | 877 | 123 | 508 | 7600 |
| 12C | 4-PESA (100) | 3106 | 875 | 54 | 299 | 6400 |

As is apparent from the results set forth in Table 16, polishing compositions comprising 2-pyridineethanesulfonic acid or 4-pyridineethanesulfonic acid exhibit suitable polishing properties, including TEOS removal rates as high as about 3100 Å/min, SiN removal rates as high as about 900 Å/min, and polySi removal rates as low as about 50 Å/min. In addition, the polishing compositions exhibited improved defectivity performance, including counts as low as about 300 at the 0.16 µm threshold.

Example 13

This example demonstrates that polishing compositions of the invention, which comprise a ceria abrasive, cations of one or more lanthanide metals, one or more alkylene oxide containing polymers, one or more anionic polymeric complexing agents, one or more phosphonic acids, and polyacrylic acid or polyvinylpyrrolidone, and water exhibit good overall substrate polishing properties, including a high removal rate of TEOS with good polySi selectivity and suitable dishing performance.

Silicon wafers comprising TEOS were polished under the same conditions with 3 different polishing compositions identified as Polishing Compositions 13A-13C. Each of the polishing compositions contained, as concentrates, 2.4 wt. % HC-60™ wet-process ceria, 480 ppm La(NO$_3$)$_3$;6H$_2$O, 1 wt. % PEG (8,000 MW), 480 ppm DEQUEST™ 2000EG, 200 ppm NH$_4$OH, and 4,000 ppm PLURONIC™ L31 surfactant. The concentrates were diluted with deionized water to 0.4 wt. % solids at point-of-use. Polishing Composition 13B further contained 500 ppm polyacrylic acid, and Polishing Composition 13C further contained 500 ppm polyvinylpyrrolidone.

The dishing performance was evaluated for each polishing composition, and the results are set forth in Table 18.

TABLE 17

| Comp. | PAA (ppm) | PVP (ppm) |
|---|---|---|
| 13A | 0 | 0 |
| 13B | 500 | 0 |
| 13C | 0 | 500 |

TABLE 18

| | oxide trench loss-100 μm (Å) | | | oxide trench loss-100 μm at 25% overpolish (Å) | | | 1 μm dishing at 25% overpolish (Å) |
|---|---|---|---|---|---|---|---|
| Comp. | 20% | 30% | 50% | 20% | 30% | 50% | |
| 13A | 706 | 688 | 700 | 948 | 652 | 676 | 27 |
| 13B | 570 | 612 | 704 | 486 | 580 | 623 | 14 |
| 13C | 28 | 108 | 220 | 27 | 105 | 174 | 0 |

As is apparent by the results set forth in Table 17, polishing compositions of the invention comprising a ceria abrasive, cations of one or more lanthanide metals, one or more alkylene oxide containing polymers, one or more anionic polymeric complexing agents, one or more phosphonic acids, and polyacrylic acid or polyvinylpyrrolidone, and water exhibit suitable polishing properties.

As is apparent by the results set forth in Table 18, the dishing on 100 μm features was reduced from 948 Å to 27 Å with polyvinylpyrrolidone (13C) at 25% overpolish, representing about an improvement of about 97%. In addition, the trench loss for 1 μm features was improved with the addition of polyacrylic acid and polyvinylpyrrolidone.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
   (a) a ceria abrasive,
   (b) cations of one or more lanthanide metals,
   (c) one or more nonionic polymers selected from the group consisting of alkylene oxide, containing polymers, acrylamide polymers, and mixtures thereof,
   (d) one or more phosphinocarboxylate polymers, and
   (e) water.

2. The polishing composition of claim 1, wherein the ceria abrasive is a wet-process ceria and is present in an amount of about 0.1 wt.% to about 10 wt.% of the polishing composition.

3. The polishing composition of claim 1, wherein the cations of one or more lanthanide metals are present in a concentration of about 10 ppm to about 5,000 ppm.

4. The polishing composition of claim 1, wherein the nonionic polymers are one or more alkylene oxide containing polymers and are present in an amount of 0.05 wt.% to about 5 wt.% of the polishing composition.

5. The polishing composition of claim 4, wherein the average molecular weight of the alkylene oxide containing polymers is about 100,000 g/mol or less.

6. The polishing composition of claim 5, wherein the average molecular weight of the alkylene oxide containing polymers is about 10,000 g/mol or less.

7. The polishing composition of claim 4, wherein the alkylene oxide containing polymers are selected from the group consisting of polyethylene glycols, polypropylene glycols, polyetheramines, ethoxylated acetylenic diols, and mixtures thereof.

8. The polishing composition of claim 4, wherein the alkylene oxide containing polymers are selected from the group consisting of copolymers of polyethylene glycol and polypropylene glycol.

9. The polishing composition of claim 8, wherein the copolymers of polyethylene glycol and polypropylene glycol have an average molecular weight of about 1,100 g/mol.

10. The polishing composition of claim 1, wherein the one or more nonionic polymers is an acrylamide polymer.

11. The polishing composition of claim 10, wherein the one or more acrylamide polymers is polyacrylamide.

12. The polishing composition of claim 1, further comprising one or more anionic polymeric complexing agents.

13. The polishing composition of claim 12, wherein the one or more anionic polymeric complexing agents is selected from the group consisting of polyacrylic acid, poly(methacrylic) acid, and mixtures thereof.

14. The polishing composition of claim 1, further comprising one or more phosphonic acids.

15. The polishing composition of claims 1, further comprising one or more sulfonic acids.

16. The polishing composition of claim 1, further comprising polyvinylpyrrolidone.

* * * * *